(12) United States Patent
Fukuda

(10) Patent No.: US 11,767,053 B2
(45) Date of Patent: Sep. 26, 2023

(54) ELECTRONIC CONTROL DEVICE AND ELECTRIC POWER STEERING DEVICE

(71) Applicant: Hitachi Astemo, Ltd., Hitachinaka (JP)

(72) Inventor: Tomohiro Fukuda, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 313 days.

(21) Appl. No.: 17/293,785

(22) PCT Filed: Dec. 12, 2019

(86) PCT No.: PCT/JP2019/048613
§ 371 (c)(1),
(2) Date: May 13, 2021

(87) PCT Pub. No.: WO2020/137568
PCT Pub. Date: Jul. 2, 2020

(65) Prior Publication Data
US 2022/0024513 A1    Jan. 27, 2022

(30) Foreign Application Priority Data

Dec. 27, 2018  (JP) ................................ 2018-245744

(51) Int. Cl.
*H02K 5/22*  (2006.01)
*B62D 5/04*  (2006.01)
(Continued)

(52) U.S. Cl.
CPC ............... *B62D 5/04* (2013.01); *H01R 12/91* (2013.01); *H05K 1/144* (2013.01)

(58) Field of Classification Search
CPC ........... B62D 5/04; H01R 12/91; H05K 1/144
See application file for complete search history.

(56) References Cited

U.S. PATENT DOCUMENTS 6,081,056 A    6/2000 Takagi et al.
10,253,763 B2 *  4/2019 Nakagami ............. F04C 23/008
(Continued)

FOREIGN PATENT DOCUMENTS

| CN | 1190500 A | 8/1998 |
|---|---|---|
| CN | 103318251 A | 9/2013 |

(Continued)

OTHER PUBLICATIONS

Chinese-language Office Action issued in Chinese Application No. 201980081921.6 dated Oct. 8, 2022 (nine (9) pages).

(Continued)

*Primary Examiner* — Neil Abrams
(74) *Attorney, Agent, or Firm* — Crowell & Moring LLP

(57) ABSTRACT

The assembling performance of an electronic control device can be improved. An electronic control device includes a control board 12 and a power source conversion board 13. The control board 12 includes a first power source terminal 15, a first GND terminal 16, and a male floating connector 17 on one surface. The power source conversion board 13 includes a second power source gripping terminal 18 electrically connected to the first power source terminal 15, a second GND gripping terminal 19 electrically connected to the first GND terminal 16, and a female floating connector 20 electrically connected to a male floating connector 17 on one surface.

8 Claims, 3 Drawing Sheets

(51) Int. Cl.
*H01R 12/91* (2011.01)
*H05K 1/14* (2006.01)

(56) References Cited

U.S. PATENT DOCUMENTS

| | | | | |
|---|---|---|---|---|
| 10,435,060 | B2* | 10/2019 | Hagiwara | ............ H05K 5/0069 |
| 10,770,955 | B2* | 9/2020 | Hamada | ................. H02K 11/33 |
| 10,971,976 | B2* | 4/2021 | Hagiwara | ............... G01L 5/221 |
| 11,381,131 | B2* | 7/2022 | Kanazawa | ............... H02K 5/225 |
| 2003/0200761 | A1* | 10/2003 | Funahashi | ........... F04C 29/0085 |
| | | | | 62/228.4 |
| 2005/0167183 | A1* | 8/2005 | Tominaga | .......... H05K 7/14322 |
| | | | | 180/444 |
| 2009/0137145 | A1 | 5/2009 | Arts et al. | |
| 2012/0329316 | A1 | 12/2012 | Wu | |
| 2013/0224050 | A1 | 8/2013 | Nakagami et al. | |
| 2013/0248277 | A1 | 9/2013 | Hagiwara et al. | |
| 2014/0091683 | A1* | 4/2014 | Ito | ....................... B62D 5/0406 |
| | | | | 310/68 R |
| 2016/0174393 | A1 | 6/2016 | Asao et al. | |
| 2016/0226334 | A1* | 8/2016 | Falguier | ................. H02K 5/207 |
| 2016/0244088 | A1 | 8/2016 | Hagiwara | |
| 2016/0347354 | A1* | 12/2016 | Asao | ........................ H02K 3/28 |
| 2018/0248451 | A1 | 8/2018 | Hagiwara | |
| 2019/0028004 | A1 | 1/2019 | Hamada | |
| 2022/0024513 | A1* | 1/2022 | Fukuda | ................. B62D 5/0406 |
| 2022/0278594 | A1* | 9/2022 | Nakano | ................... H02K 11/33 |
| 2022/0345003 | A1* | 10/2022 | Fukuda | ................... H02K 11/33 |

FOREIGN PATENT DOCUMENTS

| | | |
|---|---|---|
| CN | 105359345 A | 2/2016 |
| CN | 105612086 A | 5/2016 |
| CN | 107851918 A | 3/2018 |
| CN | 107925315 A | 4/2018 |
| JP | 8-88062 A | 4/1996 |
| JP | 2009-125597 A | 6/2009 |
| JP | 2012-120279 A | 6/2012 |
| JP | 2013-60119 A | 4/2013 |
| JP | 2017-163682 A | 9/2017 |

OTHER PUBLICATIONS

International Search Report (PCT/ISA/210) issued in PCT Application No. PCT/JP2019/048613 dated Mar. 24, 2020 with English translation (five (5) pages).

Japanese-language Written Opinion (PCT/ISA/237) issued in PCT Application No. PCT/JP2019/048613 dated Mar. 24, 2020 (five (5) pages).

* cited by examiner

ELECTRONIC CONTROL DEVICE AND ELECTRIC POWER STEERING DEVICE

TECHNICAL FIELD

The present invention relates to an electronic control device and an electric power steering device.

BACKGROUND ART

In recent years, the number of parts mounted on a vehicle has been increasing with the electronic motorization and automatic driving of automobiles. On the other hand, the mounting space of the devices on the vehicle is becoming narrower. Therefore, it is inevitable to save space for the electric power steering device mounted on the vehicle.

On the other hand, electric power steering devices are required to have higher performance due to the increase in functions accompanying the electronic motorization and automatic operation. From such a background, there is a need for an electric power steering device that can save space and improve performance.

CITATION LIST

Patent Literature

PTL 1: JP 2012-120279 A

SUMMARY OF INVENTION

Technical Problem

For example, in an electric compressor of PTL 1, at least one board in the power unit, the control unit, and the filter unit is detachably fixed to the housing body in the inverter housing chamber, and the other at least one board is detachably fixed to the cover. Therefore, if the cover is removed from the housing body when any of the power unit, control unit, and filter unit fails, the power unit, control unit, and filter unit can be independently removed from the housing body or cover, and can be easily replaced.

However, in the electric compressor of PTL 1, an external connection connector, a connector for connecting the board of the control unit, and a connector for connecting the board of the filter unit are attached to one surface of the board of the power unit. Therefore, the space between the parts is restricted, which is a factor that hinders the mounting efficiency of the parts, and sufficient consideration has not been given to space saving of the device. Further, as the space saving and high performance of the device progress, the connectors on the substrate of the power unit become overcrowded, so that the assembling property of the device may be deteriorated.

The invention has been made in view of the above circumstances, and an object of the invention is to provide a technique capable of improving the assembling performance of an electronic control device.

Solution to Problem

In order to solve the above problems, an electronic control device according to the invention includes a first board that is provided with a first power source terminal, a first GND terminal, and a first movable connector on one surface, and a second board that is provided with a second power source terminal electrically connected to the first power source terminal, a second GND terminal electrically connected to the first GND terminal, and a second movable connector electrically connected to the first movable connector on one surface.

Advantageous Effects of Invention

According to the invention, the assembling performance of the electronic control device can be improved.

DESCRIPTION OF EMBODIMENTS

Before explaining embodiments of the invention, the configuration of an electric power steering device 1 will be briefly described with reference FIG. 1 as an example to which the invention is applied.

Figure 1:
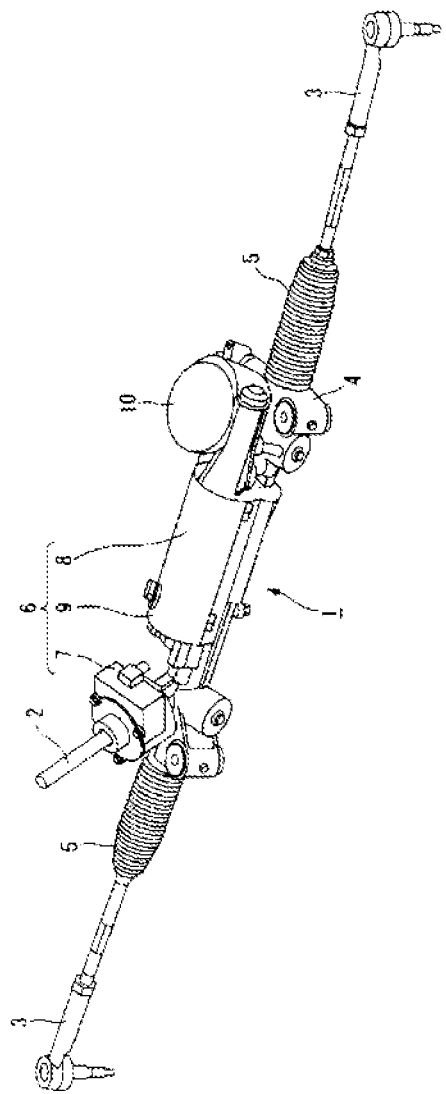
FIG. 1 is a perspective view of an electric power steering device.

FIG. 1 is a perspective view of an electric power steering device.

The electric power steering device 1 is a device for steering the steering wheels (usually front wheels) of an automobile, and includes a steering shaft 2, a tie rod 3, a rack housing 4, a rubber boot 5, an electric drive device 6, and a gear 10. The upper end of the steering shaft 2 is connected to a steering wheel (not illustrated). A pinion (not illustrated) is provided at the lower end of the steering shaft 2. The pinion meshes with a rack (not illustrated) that is long in the left-right direction of the vehicle body. The tie rods 3 for steering the front wheels in the left-right direction are connected to both ends of the rack. The rack is covered by the rack housing 4. The rubber boot 5 is provided between the rack housing 4 and the tie rod 3.

The electric drive device 6 assists the torque when rotating the steering wheel. The electric drive device 6 includes a torque sensor 7, an electric motor unit 8 as an example of a "motor", and an electronic control device unit (hereinafter, ECU) 9. The torque sensor 7 detects the rotation direction and the rotation torque of the steering shaft 2. In the electric motor unit 8, a plurality of locations on the outer peripheral portion on the output shaft side are connected to the gear 10 via bolts (not illustrated). The electric motor unit 8 applies a steering assist force to the rack via the gear 10 based on the detected value of the torque sensor 7. The ECU 9 is provided at an end of the electric motor unit 8 opposite to the output shaft side. The ECU 9 controls an electric monitor arranged in the electric motor unit 8 to control the drive of the electric motor unit 8. The torque sensor 7 may be arranged separately from the electric drive device 6.

Figure 2:
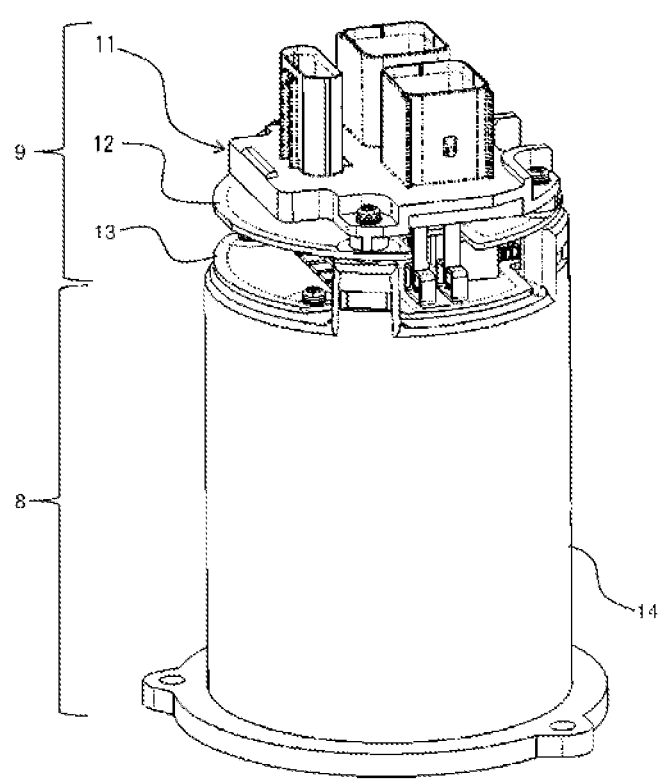
FIG. 2 is a perspective view of an electric drive device.

FIG. 2 is a perspective view of the electric drive device. Note that FIG. 2 illustrates the ECU inside the electric drive device with the cover seen through.

The ECU 9 includes a connector 11 as an example of an "external connection connector", a control board 12 as an example of a "first board", and a power conversion board 13 as an example of a "second board". Details of the connector 11, the control board 12, and the power conversion board 13 will be described with reference to FIG. 3.

As illustrated in FIG. 2, the electric motor unit 8 includes a motor housing 14 as an example of a tubular "housing" made of an aluminum alloy or the like, and an electric motor (not illustrated) housed in the motor housing 14. Since the specific structure of the electric motor is well known, the description thereof is omitted here. The coil input terminal of the electric motor is electrically connected to the output terminal of a power switching element (not illustrated) mounted on the power conversion board 13 via a motor coil wire.

In the electric drive device 6 configured in this way, when the steering wheel is operated, the steering shaft 2 is rotated in either direction. At this time, the torque sensor 7 detects the rotation direction and the rotation torque of the steering shaft 2. The ECU 9 calculates the drive operation amount of the electric motor based on the detected value detected by the torque sensor 7. The power switching element of the power conversion board 13 drives the electric motor based on the drive operation amount calculated by the ECU 9. As a result, the output shaft of the electric motor is rotated so as to drive the steering shaft 2 in the same direction as the operating direction. The rotation of the output shaft is transmitted from a pinion (not illustrated) to a rack (not illustrated) via the gear 10, and the automobile is steered. Since these configurations and actions are already well known, further description thereof will be omitted.

Figure 3:
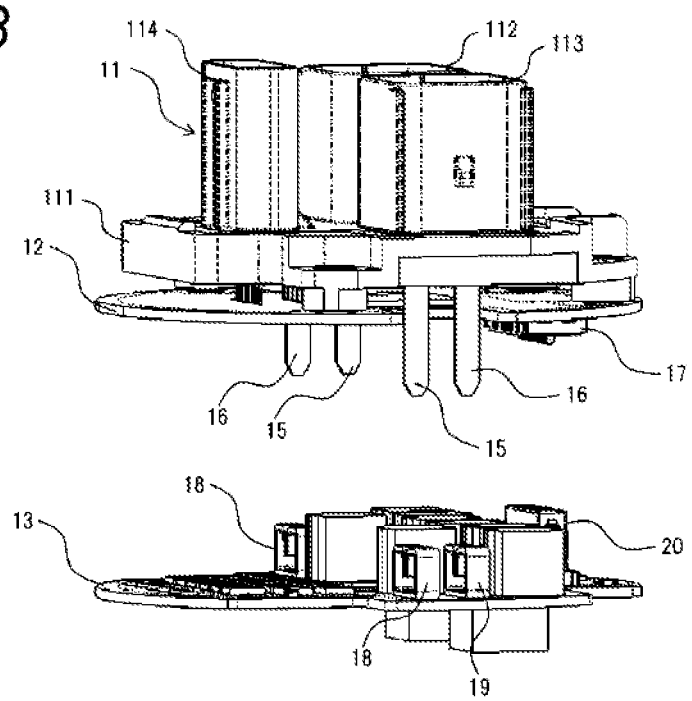
FIG. 3 is an exploded perspective view of the electronic control device.

FIG. 3 is an exploded perspective view of the electronic control device.

The connector 11 includes a flange 111, a pair of connector housings 112 and 113 having a square cross section, and a connector housing 114 having a flat cross section, and is connected to an external power source. The pair of connector housings 112 and 113 and the connector housing 114 are erected from one surface (upper surface in FIG. 3) of the flange 111. A pair of a first power source terminal 15 and a first GND terminal 16 as an example of the "first GND terminal" are erected on both ends of the other surface (lower surface in FIG. 3) of the flange 111 (4 in total). The first power source terminal 15 and the first GND terminal 16 are made of a copper material processed into an elongated plate shape. The first power source terminal 15 and the first GND terminal 16 are electrically connected to the terminals in the connector housings 112 and 133.

The control board 12 has a control circuit. A male floating connector 17 as an example of a "first movable connector" for transmitting a signal is mounted on one surface (lower surface in FIG. 3) of the control board 12. The connector 11 is attached to the other surface (upper surface in FIG. 3) of the control board 12. The flange 111 of the connector 11 attached to the control board 12 covers the other surface of the control board 12, and the first power source terminal 15 and the first GND terminal 16 project from both ends of one surface of the control board 12.

The power conversion board 13 has a power conversion circuit. On one side (upper surface in FIG. 3) of the power conversion board 13, a second power source gripping terminal 18 as an example of a "second power source terminal", a second GND gripping terminal 19 as an example of a "second GND terminal", and a female floating connector 20 as an example of a "second movable connector" are mounted. The second power source gripping terminal 18 is electrically connected to the first power source terminal 15. The second GND gripping terminal 19 is electrically connected to the first GND terminal 16. The female floating connector 20 is electrically connected to the male floating connector 17 while absorbing an error during fitting. The other side of the power conversion board 13 is attached to the motor housing 14 with screws or the like. A heat-dissipating grease may be applied between the power conversion board 13 and the motor housing 14.

The connector 11 and the power conversion board 13 are electrically connected by electrically connecting the first power source terminal 15 and the second power source gripping terminal 18, and the first GND terminal 16 and the second GND gripping terminal 19, respectively. Further, the control board 12 and the power conversion board 13 are electrically connected by electrically connecting the male floating connector 17 and the female floating connector 20.

Next, the connection (insertion) order of the power source terminals 15 and 18, the GND terminals 16 and 19, and the floating connectors 17 and 20 will be described. After the first power source terminal 15 and the first GND terminal 16 are electrically connected to the second power source gripping terminal 18 and the second GND gripping terminal 19 at the same time, the male floating connector 17 is electrically connected to the female floating connector 20.

In this way, the floating connectors 17 and 20 are used for the electrical connection between the control board 12 and the power source conversion board 13. As a result, even after positioning the four terminals 15, 16, 18, and 19 in total, the position of the connection portion between the control board 12 and the power conversion board 13 can be adjusted, and the stress applied to the terminals 15, 16, 18, and 19 can be reduced. Therefore, the assembling performance of the ECU 9 can be improved.

Since the terminals 15, 16, 18, and 19 are the terminals of the connector 11, the connector 11 and the power conversion board 13 can be connected without going through the control board 12.

The gripping terminals 18 and 19 are applied to the electrical connection between the control board 12 and the power conversion board 13. As a result, it can be assembled without using soldering or the like, and the assembling performance of the ECU 6 can be improved.

Further, the terminals 15, 16, 18, and 19 are set to a length to which the power source terminals 15 and 18 and the GND terminals 16 and 19 are connected before the floating connectors 17 and 20.

By intentionally shifting the connection timings of the power source terminals 15 and 18, the GND terminals 16 and 19, and the floating connectors 17 and 20, the insertion loads of the power source terminals 15 and 18, the GND terminals 16 and 19, and the floating connectors 17 and 20 can be detected, respectively. Therefore, it is possible to detect the success or failure of the fitting when the control board 12 and the power conversion board 13 are assembled, and the assembly reliability of the ECU 9 can be improved.

In particular, it is desirable that the fitting allowance between the first power source terminal 14 and the second power source gripping terminal 16, and the first GND terminal 15 and the second GND gripping terminal 17 be longer than the fitting allowance between the male floating connector 19 and the female floating connector 20.

This makes it possible to detect the insertion load during the insertion of the power source terminals 14 and 16, the GND sandwiching terminals 15 and 17, and the floating connectors 19 and 20, respectively.

Figure 4:
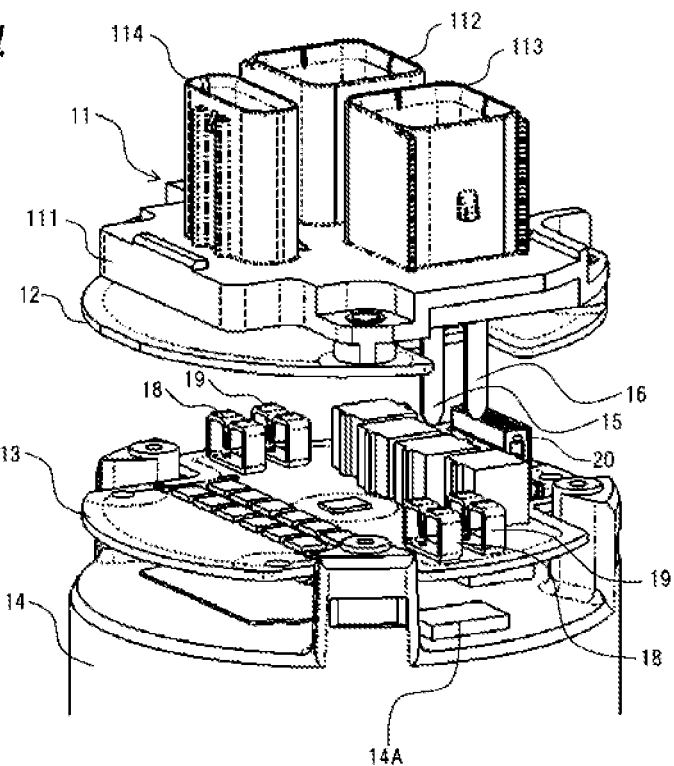
FIG. 4 is an exploded perspective view of an electronic control device and a motor housing.

FIG. 4 is an exploded perspective view of the electronic control device and the motor housing.

Further, the motor housing 14 has a convex portion 14A as an example of a "support portion" that supports the other surfaces of the power conversion board 13 that are opposite to the second power source gripping terminal 18 and the second GND gripping terminal 19.

As a result, even if the four terminals, the first power source terminals 15 and the first GND terminals 16, are connected to the second power source gripping terminals 18 and the second GND gripping terminals 19 at the same time from above, the power conversion board 13 does not bend. As a result, the solder reliability and assembling performance of the gripping terminals and 19 and the electronic components around them can be improved.

Figure 5:
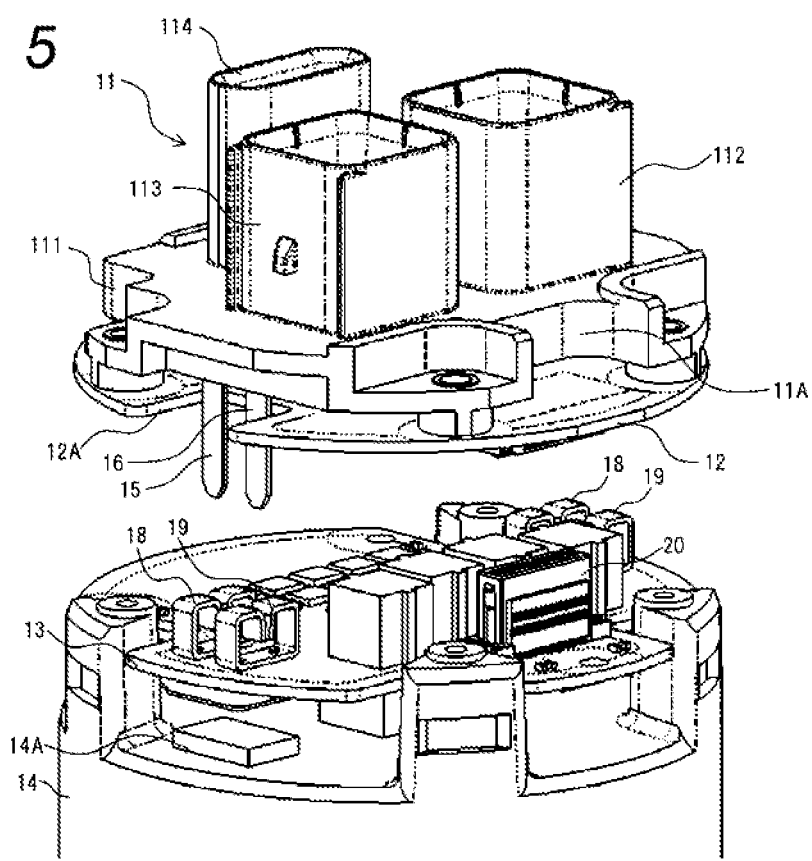
FIG. 5 is another exploded perspective view of the electronic control device and the motor housing.

FIG. 5 is another exploded perspective view of the electronic control device and the motor housing.

Further, the flange 111 of the connector 11 includes a notch 11A as an example of an "exposed portion" that exposes the side opposite to the male floating connector 17 on the other surface of the control board 12.

As a result, when the male floating connector 17 and the female floating connector 20 are fitted together, even if stress is generated around the male floating connector 19, the control board 12 can be gripped by a production jig. Therefore, the control board 12 is less likely to bend, and the solder reliability and assembling performance of the male floating connector 17 and the electronic components around it are improved.

Further, a pair of notches 12A as an example of an "insertion portion" is provided on the outer periphery of the control board 12. The first power source terminal 15 and the first GND terminal 16 are inserted through each notch 12A.

As a result, the first power source terminal 15 and the first GND terminal 16 of the connector 11 are directly connected to the power source conversion board 13 without passing through the control board 12, and the connector 11 and the power source conversion board 13 can be connected without passing a large current from the connector 11 to the control board 12. Therefore, it is possible to mount IC components that cannot be mounted on the control board 12 through which a large current flows, and it is possible to mount components with a narrow space between the IC components, and high-density mounting of components on the control board 12 can be mounted.

The above embodiments have been described in detail for clear understating of the invention, and are not necessarily limited to those having all the described configurations. It is also possible to replace a part of the configuration of one embodiment with the configuration of another embodiment. It is also possible to add other embodiments to the configuration of one embodiment. In addition, other configurations may be added, deleted, or replaced with respect to a part of the configurations of the embodiment.

Further, the technical features included in the above-described embodiments are not limited to the combinations specified in the claims, and can be appropriately combined.

For example, in the above embodiment, the control board 12 is provided with the first power source terminal 15 and the first GND terminal 16, and the power source conversion board 13 is provided with the second power source gripping terminal 18 and the second GND gripping terminal 19. Not limited to this, the control board 12 may be provided with the second power source gripping terminal 18 and the second GND gripping terminal 19, and the power source conversion board 13 may be provided with the first power source terminal 15 and the first GND terminal 16.

For example, in the above embodiment, the control board is provided with the male floating connector 17, and the power source conversion board 13 is provided with the female floating connector 20. Not limited to this, the control board 12 may be provided with the female floating connector 20, and the power source conversion board 13 may be provided with the male floating connector 17.

REFERENCE SIGNS LIST 1 electric power steering device
8 electric motor unit
9 ECU
11 connector
11A notch
12 control board
12A notch
13 power source conversion board
14 motor housing
14A convex portion
15 first power source terminal
16 first GND terminal
17 male floating connector
18 second power source gripping terminal
19 second GND gripping terminal
20 female floating connector

The invention claimed is:

1. An electronic control device, comprising:
a first board that is provided with a first power source terminal, a first GND terminal, and a first movable connector on one surface;
a second board that is provided with a second power source terminal electrically connected to the first power source terminal, a second GND terminal electrically connected to the first GND terminal, and a second movable connector electrically connected to the first movable connector on one surface; and
an external connection connector that is connected to an external power source,
wherein the first power source terminal and the first GND terminal are terminals of the external connection connector which are mounted on the other side of the first board and project from the one surface of the first board.

2. The electronic control device according to claim 1, wherein the second power source terminal and the second GND terminal are gripping terminals.

3. The electronic control device according to claim 2, wherein, after the first power source terminal and the second power source terminal are electrically connected to the first GND terminal and the second GND terminal, the first movable connector and the second movable connector are electrically connected.

4. The electronic control device according to claim 3, wherein a fitting allowance between the first power source terminal and the second power source terminal and the first GND terminal and the second GND terminal is longer than a fitting allowance of the first movable connector and the second movable connector.

5. The electronic control device according to claim 4, wherein the second board is attached to a housing, and
wherein the housing is provided with a support portion that supports the other surface of the second substrate, which is opposite to the second power source terminal and the second GND terminal.

6. The electronic control device according to claim 5, wherein the external connection connector includes a flange that covers one surface of the first board, and
wherein the flange is provided with an exposed portion that exposes one surface of the first board opposite to the first movable connector.

7. The electronic control device according to claim 6, wherein the first board is provided with an insertion portion through which the first power source terminal and the first GND terminal are inserted.

8. An electric power steering device, comprising:
a motor; and
an electronic control device that controls driving of the motor,
wherein the electronic control device includes
a first board that is provided with a first power source terminal, a first GND terminal, and a first movable connector on one surface,
a second board that is provided with a second power source terminal electrically connected to the first power source terminal, a second GND terminal electrically connected to the first GND terminal, and a second movable connector electrically connected to the first movable connector on one surface, and
an external connection connector that is connected to an external power source,
wherein the first power source terminal and the first GND terminal are terminals of the external connection connector which are mounted on the other side of the first board and project from the one surface of the first board.

\* \* \* \* \*